(12) United States Patent
Stuart et al.

(10) Patent No.: US 9,287,112 B2
(45) Date of Patent: Mar. 15, 2016

(54) SLAB LASER AND AMPLIFIER AND METHOD OF USE

(71) Applicants: Martin A. Stuart, Burbank, CA (US); Stephen L. Cunningham, Altadena, CA (US)

(72) Inventors: Martin A. Stuart, Burbank, CA (US); Stephen L. Cunningham, Altadena, CA (US)

(*) Notice: Subject to any disclaimer, the term of this patent is extended or adjusted under 35 U.S.C. 154(b) by 0 days.

(21) Appl. No.: 14/418,500

(22) PCT Filed: Aug. 1, 2013

(86) PCT No.: PCT/US2013/053166
§ 371 (c)(1),
(2) Date: Jan. 30, 2015

(87) PCT Pub. No.: WO2014/022635
PCT Pub. Date: Feb. 6, 2014

(65) Prior Publication Data
US 2015/0311064 A1  Oct. 29, 2015

Related U.S. Application Data

(63) Continuation of application No. 13/566,144, filed on Aug. 3, 2012.

(60) Provisional application No. 61/515,078, filed on Aug. 4, 2011.

(51) Int. Cl.
*H01S 3/08* (2006.01)
*H01S 3/091* (2006.01)
(Continued)

(52) U.S. Cl.
CPC .......... *H01L 21/02266* (2013.01); *C23C 16/27* (2013.01); *H01L 21/02115* (2013.01);
(Continued)

(58) Field of Classification Search
CPC .... G02B 6/1225; G02B 6/1223; H01S 3/042; H01S 3/0602; H01S 3/02316; H01S 3/027; H01S 3/025
USPC .............................. 372/92–108; 359/333–349
See application file for complete search history.

(56) References Cited

U.S. PATENT DOCUMENTS 3,633,126 A  1/1972  Martin et al.
4,769,823 A  9/1988  Dube
(Continued)

FOREIGN PATENT DOCUMENTS

DE  4220158 A1  12/1993
EP  1 566 865 A2  8/2005
(Continued)

OTHER PUBLICATIONS

International Search Report; International Application No. PCT/US2013/053166; International Filing Date: Aug. 1, 2013; Date of Actual Completion of International Search: Oct. 24, 2013; Date of Mailing of International Search Report: Nov. 28, 2013.

*Primary Examiner* — Karen Kusumakar
(74) *Attorney, Agent, or Firm* — Pearne & Gordon LLP

(57) ABSTRACT

A slab laser and its method of use for high power applications including the manufacture of semiconductors and deposition of diamond and/or diamond-like-carbon layers, among other materials. A lamp driven slab design with a face-to-face beam propagation scheme and an end reflection that redirects the amplified radiation back out the same input surface is utilized. A side-to-side amplifier configuration permitting very high average and peak powers having scalability is also disclosed. Cavity filters adjacent to pump lamps convert the normally unusable UV portion of the pump lamp spectrum into light in the absorption band of the slab laser, thereby increasing the overall pump efficiency. The angle of the end reflecting surface is changed to cause the exit beam to be at a different angle than the inlet beam, thereby eliminating the costly need to separate the beams external to the laser with the subsequent loss of power.

50 Claims, 9 Drawing Sheets

(51) Int. Cl.

| | | |
|---|---|---|
| *H01S 3/092* | (2006.01) | |
| *H01L 21/02* | (2006.01) | |
| *H01L 21/3205* | (2006.01) | |
| *H01S 3/06* | (2006.01) | |
| *H01S 3/04* | (2006.01) | |
| *H01S 3/042* | (2006.01) | |
| *H01S 3/093* | (2006.01) | |
| *H01S 3/16* | (2006.01) | |
| *H01S 3/23* | (2006.01) | |
| *H01S 3/11* | (2006.01) | |
| *H01L 31/024* | (2014.01) | |
| *H01L 31/18* | (2006.01) | |
| *C23C 16/27* | (2006.01) | |
| *G02B 6/122* | (2006.01) | |

(52) U.S. Cl.
CPC .... *H01L21/02181* (2013.01); *H01L 21/02183* (2013.01); *H01L 21/02194* (2013.01); *H01L 21/3205* (2013.01); *H01L 31/024* (2013.01); *H01L 31/18* (2013.01); *H01S 3/042* (2013.01); *H01S 3/0407* (2013.01); *H01S 3/0606* (2013.01); *H01S 3/08095* (2013.01); *H01S 3/093* (2013.01); *H01S 3/11* (2013.01); *H01S 3/1623* (2013.01); *H01S 3/1625* (2013.01); *H01S 3/1636* (2013.01); *H01S 3/1666* (2013.01); *H01S 3/2333* (2013.01); *G02B 6/1223* (2013.01)

(56) References Cited

U.S. PATENT DOCUMENTS

| | | | |
|---|---|---|---|
| 4,838,243 A | | 6/1989 | Kuber |
| 4,858,243 A | | 8/1989 | Bar-Joseph |
| 4,989,215 A | * | 1/1991 | Winik ............... H01S 3/093 372/70 |
| 5,084,889 A | | 1/1992 | Tajima |
| 5,239,549 A | | 8/1993 | Tajima et al. |
| 5,299,220 A | | 3/1994 | Brown et al. |
| 5,305,345 A | | 4/1994 | Albrecht et al. |
| 5,394,427 A | | 2/1995 | McMinn et al. |
| 5,479,430 A | | 12/1995 | Shine, Jr. et al. |
| 5,553,092 A | * | 9/1996 | Bruce ............... H01S 3/093 372/34 |
| 5,617,442 A | * | 4/1997 | Tanuma ............... H01S 3/093 372/72 |
| 5,651,021 A | | 7/1997 | Richard et al. |
| 5,832,016 A | | 11/1998 | Basu |
| 6,014,391 A | | 1/2000 | Byren |
| 6,219,361 B1 | | 4/2001 | Guch, Jr. et al. |
| 6,347,101 B1 | | 2/2002 | Wu et al. |
| 6,356,575 B1 | | 3/2002 | Fukumoto |
| 6,373,866 B1 | | 4/2002 | Black |
| 6,738,399 B1 | | 5/2004 | Albrecht et al. |
| 7,039,087 B2 | | 5/2006 | Nettleton et al. |
| 7,065,121 B2 | | 6/2006 | Filgas et al. |
| 7,123,634 B2 | | 10/2006 | Rothenberg et al. |
| 7,280,571 B2 | | 10/2007 | Rothenberg |
| 7,388,895 B2 | | 6/2008 | Gong et al. |
| 7,505,499 B2 | | 3/2009 | First et al. |
| 7,515,625 B2 | | 4/2009 | Ishizu |
| 7,542,489 B2 | | 6/2009 | Luo et al. |
| 7,800,819 B2 | | 9/2010 | Betin et al. |
| 7,822,091 B2 | | 10/2010 | Jackson et al. |
| 8,124,995 B2 | | 2/2012 | Hattori et al. |
| 8,369,375 B2 | | 2/2013 | Hattori et al. |
| 8,456,732 B2 | | 6/2013 | Yao |
| 2003/0138021 A1 | | 7/2003 | Hodgson et al. |
| 2005/0062409 A1 | * | 3/2005 | Yamazaki ........... H01L 27/3246 313/504 |
| 2005/0111496 A1 | | 5/2005 | Reeder et al. |
| 2006/0114961 A1 | | 6/2006 | Manni |
| 2006/0133444 A1 | | 6/2006 | Sukhman et al. |
| 2008/0089369 A1 | | 4/2008 | Luo et al. |
| 2008/0259987 A1 | | 10/2008 | Smith |
| 2009/0201952 A1 | | 8/2009 | Luo et al. |
| 2010/0296531 A1 | | 11/2010 | Hohm et al. |
| 2011/0069732 A1 | | 3/2011 | Smith |
| 2012/0250719 A1 | | 10/2012 | Hodgson et al. |
| 2013/0044768 A1 | | 2/2013 | Ter-Mikirtychev |
| 2013/0302358 A1 | | 11/2013 | Collins et al. |

FOREIGN PATENT DOCUMENTS

| | | |
|---|---|---|
| EP | 1 646 117 A2 | 12/2006 |
| RU | 8168 U1 | 10/1998 |

* cited by examiner

SLAB LASER AND AMPLIFIER AND METHOD OF USE

CROSS-REFERENCES TO RELATED APPLICATIONS

This application is the national phase of International Application No. PCT/US2013/053166 filed on Aug. 1, 2013, which claims the benefit of U.S. application Ser. No. 13/566,144 that was filed on Aug. 3, 2012. The entire disclosures thereof are incorporated herein by reference.

BACKGROUND

This application relates generally to the field of Lasers and Laser Amplifiers. More specifically, the application relates to solid state laser amplifiers in the form of a slab which are pumped optically by lamps and where the laser beam enters through a Brewster angle facet and experiences multiple face to face bounces due to total internal reflection before exiting through the same face as that the beam entered.

Generally, lamp driven slab lasers have existed for many years. The prior art is exemplified by General Electric's design of a Krypton arc lamp driven, face pumped, face to face multi-bounce, total internal reflection (TIR) Nd:Yag (Neodymium doped Yttrium Aluminum Garnet) slab. In General Electric's design, the Nd:Yag crystal was face pumped with Krypton arc lamps. These particular designs achieved a conversion efficiency (laser power out divided by electrical power in) of ~4% with an output that reached several Kilowatts. In this design, Krypton arc flash or arc lamps (consisting of cerium doped quartz envelopes) discharging a spectrum of blackbody and line emission photons that were subsequently reflected as evenly as possible onto the adjacent faces of the Neodymium doped Yttrium Aluminum Garnet slab. This gain element selectively absorbed portions of this energy. This energy excited the Neodymium atoms into an elevated energy state from which the laser beam was generated or amplified.

Later versions incorporated Diode laser pump sources to increase efficiency and architectural simplicity (by producing only a particular frequency of photonic energy that is highly absorbed by the doped Yag). Still later versions employed Nd doped Ytterbium Vanadate ($YbVO_4$) as the gain medium. Such systems have become the standard with the limitation being the maximum size that YAG, Vanadate or gain crystals can be fabricated. U.S. Pat. Nos. 3,633,126 and 3,631,362 discuss related technologies.

The previously mentioned diode pumped systems have demonstrated system efficiencies of 10%, with efficiencies that might even approach 25% in ideal circumstances, but at a high financial cost, with the breakdown being approximately 50% efficiency for the diode pump lasers, 65% efficiency for the Nd:VO4, for Nd:YAG the efficiency has been about 50% conversion to the 1.064 micron radiation, and subsequent beam clean-up reducing the system output efficiency to as low as 10% with the overall efficiency of well-designed systems being about 25%. The current upper limit to the output power has been demonstrated with both Ceramic Yag slabs that were fiber edge pumped and with face pumped versions, both of which were built chiefly by Northrop Grumman. Their system demonstrated an output of 25 kW (Kilo-Watt) per laser head, with an efficiency of ~50% for the Diode pump lasers, and a conversion efficiency of ~50% in the Nd:Yag slab for an output efficiency at approximately 25%.

The limiting efficiency for the existing lamp pumped designs are primarily in two areas. First is the inefficiency due to the fact that the emitting spectrum from the pump lamps typically does not match the excitation spectrum of the laser crystal material. Second is in the inefficiency of the beam extraction from the gain material due to having the beam pass through no more than twice and incompletely fill the gain material. These drawbacks have interfered with potential practical applications of the slab laser concept.

SUMMARY OF THE INVENTION

Presented is a transverse face-pumped, lamp-driven slab laser and amplifier design with a face to face beam propagation scheme. A TIR (total internal reflection) end bounce redirects the amplified radiation back out the same input facet, but in a different angular direction, making the presented design practical to use in a larger system, if desired.

Also presented is the use of pump lamps that produce more photons in a usable spectrum than previous lamp designs based on noble gases. Cavity fluorescent filters have also been employed that convert a non-useful portion of the lamp output to useful pump bands at a rather high efficiency. This improves efficiencies and power handling capabilities.

Provided as an example embodiment is laser device comprising: a slab crystal, and a cavity filter material provided on at least one side of the slab crystal for receiving light energy from a light source, such that the cavity filter material converts the light energy received at a first frequency band into light energy at a second frequency band that is absorbed by the slab crystal.

For the above laser, the slab crystal is adapted to receive an incident light beam into one end of the slab crystal at one angle and also emits an amplified laser beam from the one end at either an angle different than the one angle or emits the amplified laser beam linearly shifted from the incident light beam after absorbing the light energy at the second frequency.

Further provided is an example embodiment of a laser device comprising: a slab crystal; a light source providing light energy including an ultraviolet frequency band; and a cavity filter material including terbium fluoride doped with samarium that is provided on at least one side of the slab crystal for receiving the light energy from the light source, and for converting the light energy at the first ultraviolet frequency band into light energy at a second frequency band of visible light for absorption by the slab crystal for amplifying a laser beam.

The above slab crystal is adapted to emit the amplified laser beam from an end not including the back reflecting surface.

Also provided is an example embodiment of laser device comprising: a slab crystal; a light source providing light energy including a portion in an ultraviolet frequency band and a portion in a visible light frequency band; and a cavity filter material transparent to the visible light frequency band and that is provided on at least one side of the slab crystal for receiving the light energy from the light source, and for converting the light energy at the first ultraviolet frequency band into light energy at a converted frequency band less than the ultraviolet frequency band for absorption by the slab crystal.

The light source and the cavity filter material of the above laser are arranged such that at least a part of the portion of the light energy in the visible light frequency band is transmitted through the cavity filter to the slab crystal, and the slab crystal is adapted to absorb both a portion of the part of the light energy in the visible frequency band transmitted through the cavity filter and also to absorb a portion of the light energy at the converted frequency band for amplifying a laser beam for emitting from the slab laser.

Further provided is an example embodiment of a laser device comprising: a slab crystal; a light source providing light energy at a first frequency band; a cavity filter material provided on at least one side of the slab crystal for receiving a portion of the light energy from the light source, and for converting at least some of the portion of the light energy at the first frequency band into light energy at a second frequency band for at least partial absorption by the slab crystal; a plurality of elastic holders for holding components of the device while allowing for thermal expansion of one or more the components of the device; and a coolant circulation system for circulating a coolant in the device for cooling the device, such that the slab crystal is adapted to emit an amplified laser beam from an end of the slab crystal.

Also provided is an example laser device comprising: a slab crystal having a front face that forms a point provided at an acute angle with respect to a bottom of the slab crystal for receiving an incident light beam provided at a first angle with respect to the front face, the slab crystal also having a back wall that is provided at a back angle that is not 90 degrees with respect to the bottom of the slab crystal; a light source providing light energy including a portion in first frequency band and a portion in a second frequency band; and a cavity filter material transparent to the first light frequency band and that is provided on the top or the bottom of the slab crystal for receiving the light energy from the light source, and for converting the light energy at the first frequency band into light energy at a converted frequency band for at least partial absorption by the slab crystal.

The light source and the cavity filter material of the above laser are arranged such that at least part of the portion of the light energy in the second light frequency band is transmitted through the cavity filter to the slab crystal, and furthermore the slab crystal is adapted for amplifying a laser beam for emitting from the slab crystal by absorbing both a portion of the part of the light energy in the second frequency band transmitted through the cavity filter, and is by absorbing a portion of the light energy at the converted frequency band.

For the above laser, the acute angle and the back angle are chosen such that the amplified laser beam is emitted from the front face of the slab crystal at an angle that is different than the first angle such that the incident light beam entering the slab crystal is not coincident with the amplified laser beam emitted from the slab crystal.

Further provided is a laser amplification system using any plurality of any of the above lasers in series for amplifying a light beam.

Further provided is a system and method of manufacturing utilizing one or more slab lasers as described herein for manufacturing a component such as a semiconductor device or a coated conductor, for example, by vaporizing and depositing a substance on or into the component. The deposited material can be a dopant, or a layer of material such as diamond or diamond-like-carbon, for example.

Also provided are additional example embodiments, some, but not all of which, are described hereinbelow in more detail.

BRIEF DESCRIPTION OF THE DRAWINGS

The features and advantages of the example embodiments described herein will become apparent to those skilled in the art to which this disclosure relates upon reading the following description, with reference to the accompanying drawings, in which.

DETAILED DESCRIPTION OF THE INVENTION

As discussed above, provided is an example embodiment of a transverse face-pumped, lamp-driven slab laser and amplifier design with a face to face beam propagation scheme. A TIR end bounce redirects the amplified radiation back out the same input facet, but in a different angular direction, making the presented design practical to use in a larger system, if desired. By this choice of geometry, the pulse of laser light to be generated or amplified, passes through the same piece of gain material at least four times (not the normal two times) in each round trip inside the laser slab. Under the conditions of energy extraction efficiency being ~60% per pass, this would result in, e.g., about 97% of the stored energy in the laser slab being extracted. This feature contributes to the higher efficiency of the example device.

Also presented a further example embodiment is the use of pump lamps that use metal or metal halide alloys, which produce more photons in a usable spectrum than previous lamp designs based on noble gases. Cavity fluorescent filters have also been employed that convert the non-useful portion of the lamp output (in the ultraviolet portion of the spectrum for the Mercury arc lamps and Indium Iodide plus Thallium Iodide lamps for the Ti Sapphire laser) to useful pump bands at a rather high efficiency. These improvements result in a system that operates with efficiencies and power handling capabilities normally associated only with diode laser pumped versions. But the example system presented here achieves these efficiencies using lamps instead of laser diodes, and can therefore be very much less expensive to implement for the same amount of output power than prior designs using diode laser pumps.

For the presented gain materials utilized in the example designs, the presented lamp pumped designs will have power output levels that exceed the diode pumped versions of these lasers for the same size. For example, the efficiency of the visible light output (635-670 nm and 680.4 nm red light) from pump lasers utilized for Alexandrite devices operate at, e.g., approximately 20% efficiency conversion. Also, the frequency doubled Nd lasers, which output 532 nm green light, used to pump Titanium Sapphire's green absorption band, also operate at about 20% electrical to optical conversion efficiency. By comparison, the electrical to optical efficiency of metal arc and metal halide arc lamps are both near 70-73%. This improvement and architecture can be used to amplify pulsed or continuous wave laser beams to very high power levels with a system efficiency that has an upper limit approaching forty percent. The per head output is expected to be in the 6.5-15.5 kW range for the head design presented for Alexandrite (for Titanium the range is ~3.6 kW), but the designs are not limited to these power levels.

Overall Laser Device Configuration

Figure 1:
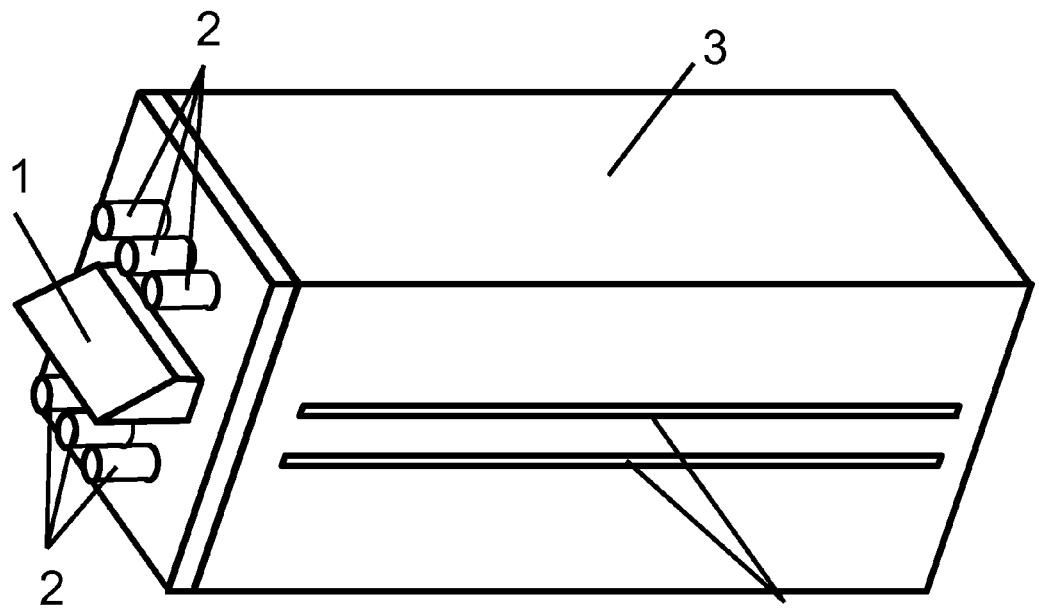
FIG. 1 is a schematic drawing of an external view of one example embodiment of the invention.

FIG. 1 shows a schematic of the general configuration of one example embodiment of this invention. The ends of the slab crystal 1 and of the six pump lamps 2 extend outside of the housing 3. The housing allows for liquid cooling through slots 4. These slots 4 enter a water manifold external to the housing 3 as will be discussed later.

Figure 2:
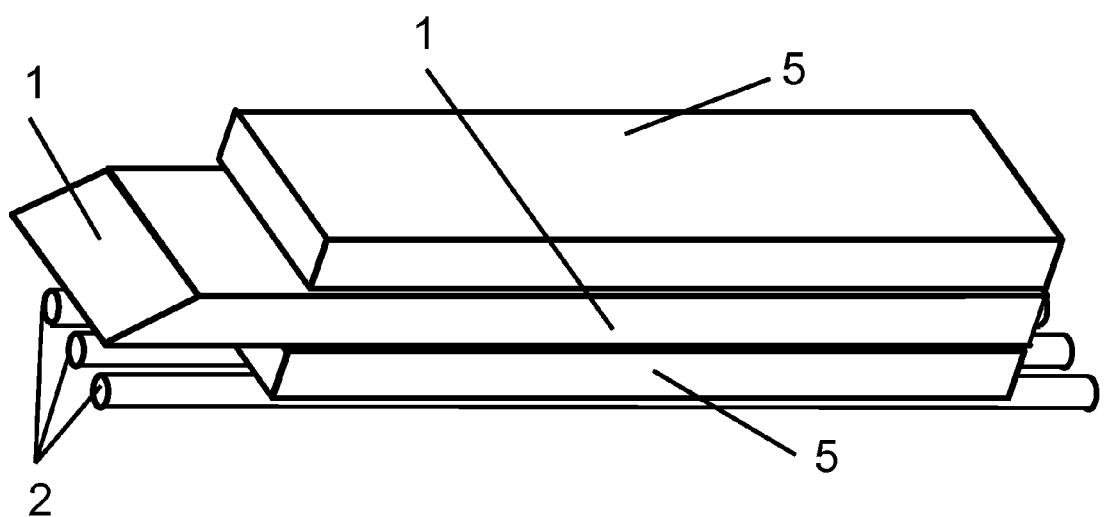
FIG. 2 is a schematic drawing showing two layers of a filter cavity material that are provided on both sides of slab laser material.

FIG. 2 shows where cavity filter slabs 5 reside inside the housing on both sides of the laser slab crystal 1. In this figure, only three of the six pump lamps 2 are shown for clarity. The purpose of the cavity filter slabs 5 is to convert the ultra-violet portion of the light emitted from the pump lamps 2 into the visible spectrum where it is more readily absorbed by the slab laser crystal 1 material.

Figure 3:
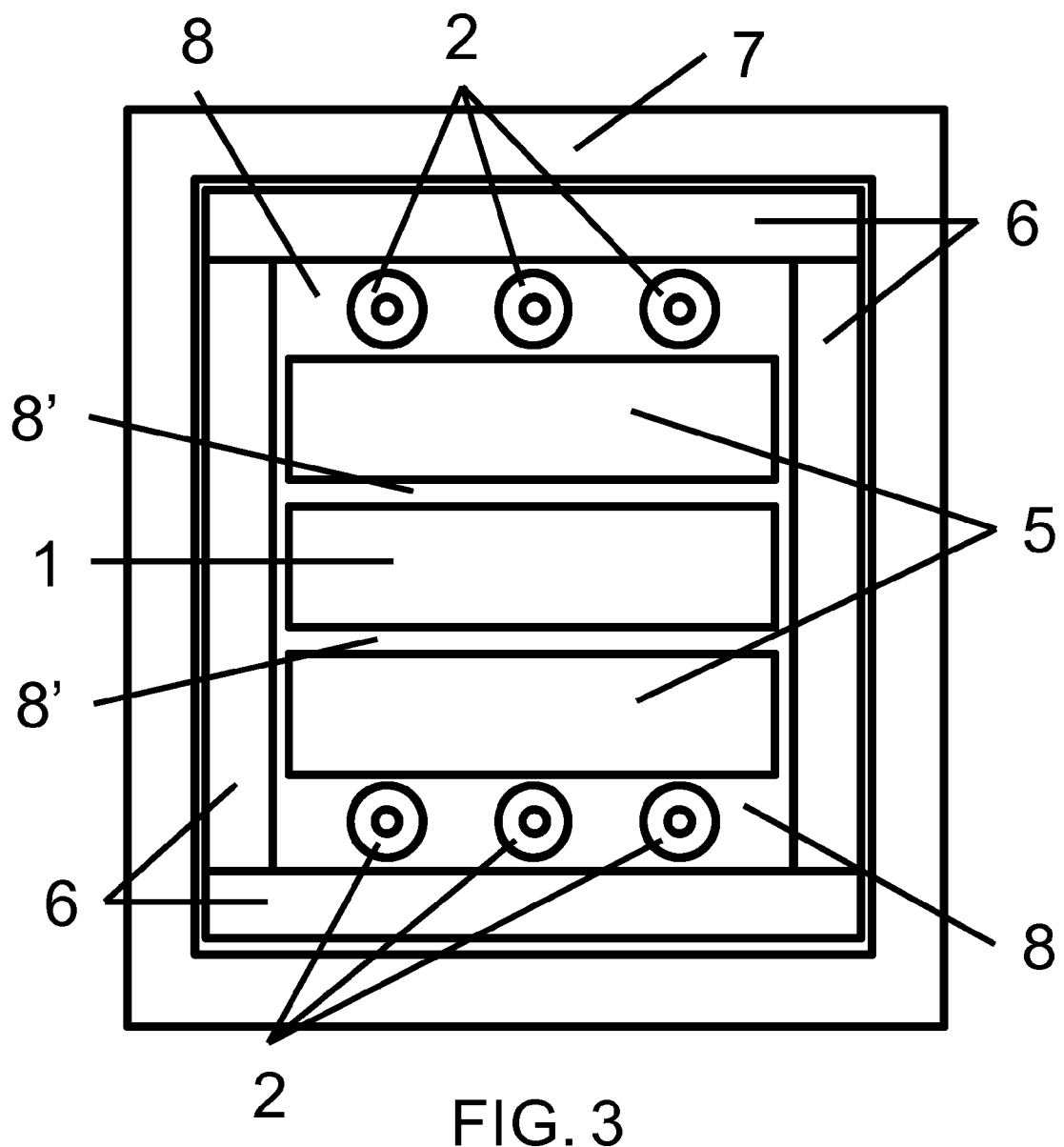
FIG. 3 is a schematic drawing of an end view of the example embodiment of the invention of FIG. 1 showing a relation between the laser slab, two cavity filters, pump lamps, a ceramic reflector, and an external case.

FIG. 3 shows a schematic of an end view of the example embodiment showing the primary elements inside the general casing. The center of the structure is the laser slab crystal 1 surrounded on top and bottom by the cavity filter slabs 5 with gaps 8'. The six lamps 2 used to pump the laser crystal 1 are provided outside the cavity filter slabs 5. Surrounding these components are four ceramic reflectors 6 which are encased in a housing 7, which can be made of stainless steel. The housing 7 in FIG. 3 can be the same type as the housing 3 in FIG. 1, but that is not a requirement. In the gaps 8' and 8 between the structures there is provided a coolant, such as cooling water, which flows to cool the lamps 2 and the slab crystal 1.

Figure 4:
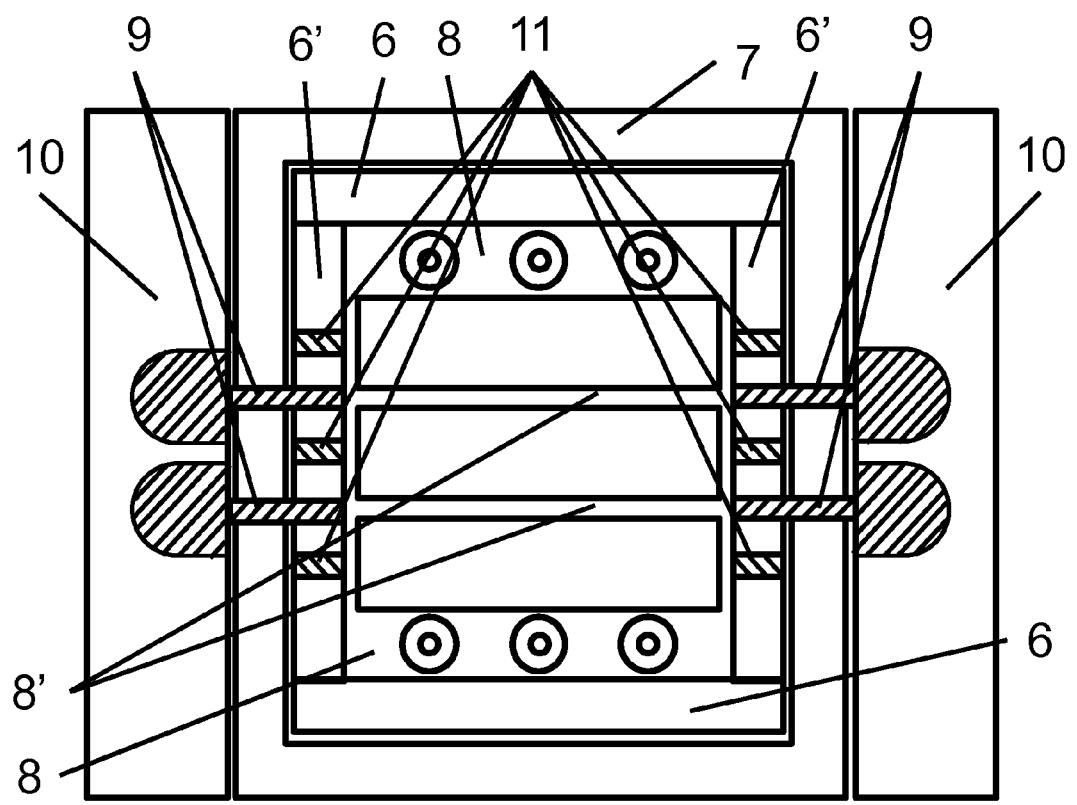
FIG. 4 is a schematic drawing of another example embodiment adding an external water manifold for cooling.

FIG. 4 shows an example embodiment providing water manifolds 10 used to cool the laser. Two manifolds 10 cover slots 9 that extend through the external case 7 and through the ceramic reflectors 6'. Water is made to flow in opposite directions through the two slots 9 and through the gaps 8' to cool the central laser slab 1. Water also flows in a separate circuit in the axial direction (in the direction of the pump lamps 2 in FIGS. 2 and 3) in gaps 8 to cool the pump lamps 2. The temperatures of the cooling water for the slab laser crystal 1 and for the pump lamps 2 can be different, since they are on separate circuits (described below) which allow for the slab to operate at an efficient temperature that is higher than that of the lamps.

In addition, in the example of FIG. 4 there are holes 11 drilled or otherwise provided in the ceramic reflectors 6' which are placed every few inches along the length of the laser slab 1 and the cavity filter slabs 5. These holes allow for silicon rubber or Teflon bumpers to be used to support the respective slabs and to absorb differences in thermal expansion as the laser elements heat up and thus expand. In addition, the silicon forms a water seal to keep the water between the slab laser crystal 1 and the cavity filter slabs 5 separate from the different temperature water that is cooling the pump lamps 2.

The Slab Laser Crystal

In one example design, the slab laser crystal 1 is comprised of Chromium doped Alexandrite ($Cr:BeAl_2O_4$), but in another example the slab laser crystal can be comprised of Titanium doped Sapphire. The bulk of the slab crystal is made up of the doped material. But it could also subsequently be processed with un-doped sections of Alexandrite crystal ($BeAl_2O_4$) or for the Ti Sapphire, clear undoped Sapphire on the edges and ends via diffusion bonding to produce clear caps. The purpose of the clear cap sections is to reduce the lens distortion due to thermal gradients produced at high pumping powers. These clear caps reduce the distortion effect by a factor of three as the undoped portion has no heat load from left over or un-extracted energy from the gain material.

The preferred crystal growth method to produce the laser slab crystal would be via the classic Heat Exchange Method (HEM). This crystal growth technology produces inclusion-free crystals for either of the example gain materials. By this method, damage free power limits of, e.g., up to 23 gigawatts per square centimeter can be realized for the Alexandrite material (with similar power handling capability results for the Sapphire material as well). On the other hand, in amplifier configurations where the Czochralski crystal growth method is used, Alexandrite crystals can be produced with a power limit of, e.g., 1-1.5 gigawatts per square centimeter radiance for 1 nanosecond pulse lengths. These damage values are well above the planned typical operating powers, which could be hundreds of mega-Watts per square centimeter.

Subsequent to obtaining the slab crystal for the laser slab, a reflective coating, such as of silicon dioxide measuring about a micron thick, can be applied to the sides and possibly the edges to act as a reflector for the amplified laser light and to protect the seals where they may overlap a bounce site.

If the designer so desires, the diffusion bonded clear caps can be omitted from the sides and the slab crystal can be enclosed on the sides inside the alumina ceramic cavity reflector with the added design element that a dielectric mirror coating be applied to the two sides and the end of the crystal to facilitate the desired reflections of the amplifying beam. This variation would permit a single seal, compressed around the body of the crystal.

The Pump Lamps

Example pump lamps 2 can utilize Mercury filled (e.g., with a 7 Torr Argon co-fill) clear polished sapphire envelopes or clear fused silica envelopes. Particularly when Sapphire is utilized, Kovar, which is a high nickel alloy that can be used in such lamps as it has a nearly matching expansion coefficient and can be brazed to the envelope using industrially standard techniques. Tungsten electrodes are brazed to the Kovar and are the electrodes establishing the arc in the Mercury.

The lamps built and energized in such a manner have an efficiency of, e.g., about 72% for Mercury and, e.g., about 70% for Thallium Iodide. These example lamps are best driven with a high frequency AC power supply. Such power supplies are commercially available and are referred to as ballasts, with operating frequencies of 40-100 kHz. The lamp is sized by choosing the waste heat removal rate (e.g., 240 W/cm$^2$ surface area using de-ionized water), and scaling to a useful size. For example, a lamp with a bore diameter of about 4.5 mm running at about 135 V/cm will pass about 5.8 amps. For a Mercury arc lamp, once the plasma has been established in the bore and the mercury has been vaporized, the impedance characteristics are such that even if the applied voltage is tripled the current will only increase by twenty percent or so. Thus, lamps 1 foot long can be run, e.g., as high as 35 KW or about 1000 watts per cm. However, for long life, the power is reduced to ~400 watts per cm and the length is shortened. Normal practice is to use a 6 mm diameter fused clear quartz with, e.g., a 2 mm bore with an arc that is about 8-15 cm long. In these lamps energized with an AC power source, there is about a 10% per electrode heat loss and care must be paid to this as unsupportable heat loads can be generated in the electrodes themselves and the immediate adjacent area on the envelope.

The Cavity Filter Slabs

Example cavity filter slabs 5 as shown in FIGS. 1-3 are each made up of a rectangular block crystal comprised of Terbium Fluoride (TbF$_3$) doped with ~0.1% Samarium, which has absorption bands that encompass most of the ultraviolet spectrum. The transfer of energy to the Samarium ion is a nearly lossless non-radiation transfer via the crystal matrix. The crystal then fluoresces at near the 595 nm peak absorption band of the Alexandrite crystal, converting otherwise wasted UV energy to useful visible light and thereby increases the pump efficiency of the system. There is a residual heat load from the energy difference between the average input frequency and the specific emission frequency. This is called the Stokes shift. The difference is responsible for residual heat in the crystal even if all or most of the available energy is extracted.

The spectral output of Mercury lamps at this power level is approximately ⅓ in the UV. Thus, the use of the cavity filter slabs to recycle as much of the UV radiation energy as possible is desirable for increased efficiency. In addition, the Terbium Fluoride filter slabs reduce the amount of UV radiation that impinges on the Alexandrite crystal. That radiation, over time, would likely damage the crystal and reduce its transparency which, in turn, limits its usefulness and thus the useful life of the laser device.

Other crystal designs are feasible to use for the cavity filter slabs as well. These include (but are not limited to) Terbium Garnet with Titanium doped Sapphire gain material; Terbium, Cerium, Titanium doped YALO; Gadolinium, Gallium, Terbium, Cerium, Samarium doped YAG; Terbium Fluoride doped with Samarium; and Terbium-Samarium doped Yttrium Lithium Fluoride. Each has its own specific advantages. Most are less efficient than Terbium Fluoride doped with Samarium, but the oxide crystals can handle higher power input levels with the offset that greater heat would be left behind due to lower conversion efficiency.

Cavity Reflectors

The example ceramic cavity reflector 6, 6' as shown in FIG. 4 can be comprised of a non-degrading ceramic including, for example, a high purity Al$_2$O$_3$ (Alumina) composition. The component can be finished with a sealing glaze that allows for a water tight seal on its edges via compressed silicon rubber seal, preferably white or clear. The cavity reflector 6 is designed to reflect the light (radiation) from the lamps 2 back into the device to be utilized. This reflector 6 is preferably made of an inert (thermally, chemically, and radiation) substance, such as the ceramic material described above.

The arrangement of the cavity reflectors 6, 6' resembles a rectangular tube with two rectangular slots at each end to facilitate water flow in the open space 8 along the length of the lamps 2. This also cools one face of the cavity filter 5. Additionally, there are square reflector end caps at each end of the pump chamber, in which there are holes allowing the lamps to pass through. There is a separate seal compression plate to allow O-ring seals, of silicon rubber, to be compressed against the lamp walls and the reflector end. At one end there is a rectangular hole for the laser slab to fit through and be sealed via compression O-ring and seal plate.

At the top and bottom outside, near the ends, there are provided two additional attachments allowing water to enter and exit each side (not shown). This is for receiving the cooling water for the lamps and partially for the cavity filter.

Shape of Slab Laser Crystal

Figure 5:
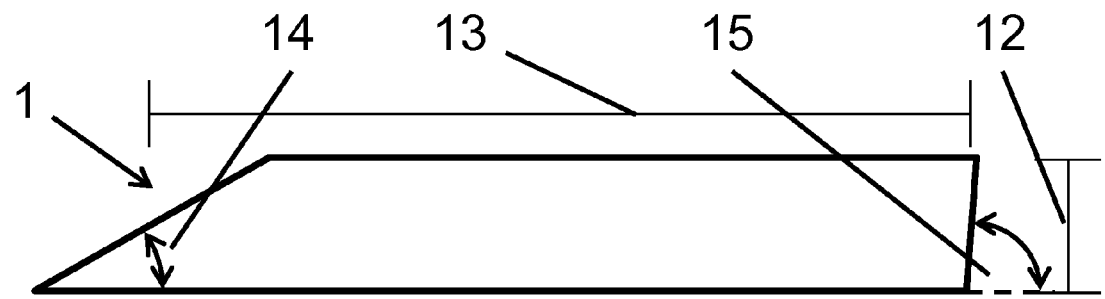
FIG. 5 is a schematic drawing of a general cross-section geometry of a laser slab of the example embodiment.

FIG. 5 shows the side view of the general shape of the example slab laser crystal 1. The shape is defined by a slab width 12, a slab length 13 as measured from the midpoint of each end, a wedge angle acting as a Brewster optical window 14 for the face where the incident and exit beams pass through, and an angle 15 for the reflecting end of the crystal. All four of these parameters are interconnected in the example embodiments, and the slab laser crystal 1 should have a specific set of these parameters for desired functioning.

Figure 6:
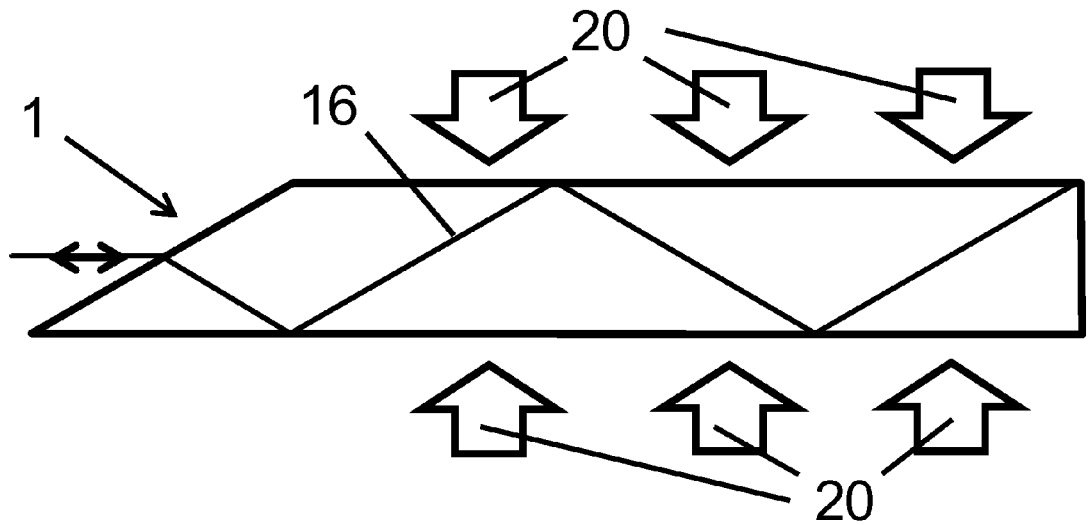
FIG. 6 is a schematic drawing of a path of the on-axis laser beam entering and leaving the amplifier slab of an example embodiment.

FIG. 6 shows a preferred example situation where the reflecting angle 15 is provided at 90 degrees and the entrance angle is set by the Brewster angle (for example, the Brewster angle for Alexandrite C axis is 60.06 degrees so the wedge angle 14 of the entrance surface is 29.94 degrees), then the desired slab length is uniquely related to the slab width. For the case of the entrance laser beam 16 located on the center line, the length should be such that the beam center impinges on the corner of the slab at the reflecting end so that the exit beam is also on the center line. For the case shown in FIG. 6, the incident and exit beam 16 are always co-linear. The light 20 from the pump lamps enters the top and bottom faces of the slab while the source laser light enters, and the amplified laser light exits, via the Brewster angle surface.

Figure 7A:
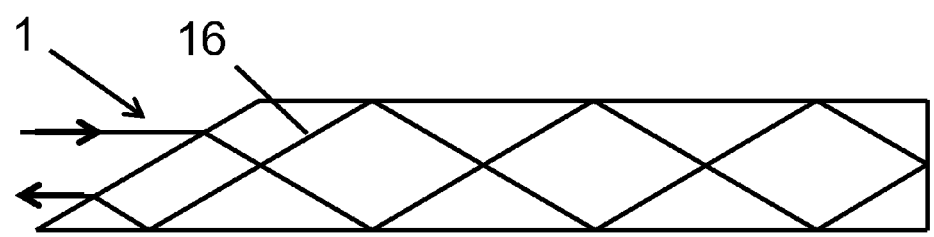
FIG. 7A is a schematic drawing of an effect of displacing a laser beam to get separation of an exit beam from the entrance beam for the example embodiment.
Figure 7B:
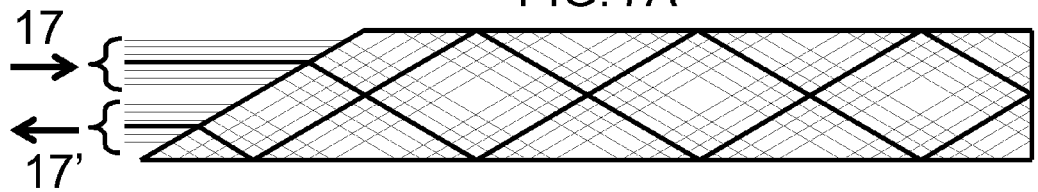
FIG. 7B is a schematic drawing of an effect of displacing a plurality of laser beams for the example embodiment shown in FIG. 7A.

When the incident beam is displaced up or down relative to the front surface of the slab, then the exit beam is also displaced in the opposite direction. This is shown in FIG. 7A, where the single incident beam 16 is halfway between the centerline and the edge of the entrance window. Then, if the incident beam (or plurality of beams) is only half of the size of the window as shown by 17 in FIG. 7B, then the exit beam 17' is physically separate from the incident beam 17. This configuration solves the problem of the separation of the beams, but limits the beam cross sectional area to be less than half of the size of the slab face.

Figure 8A:
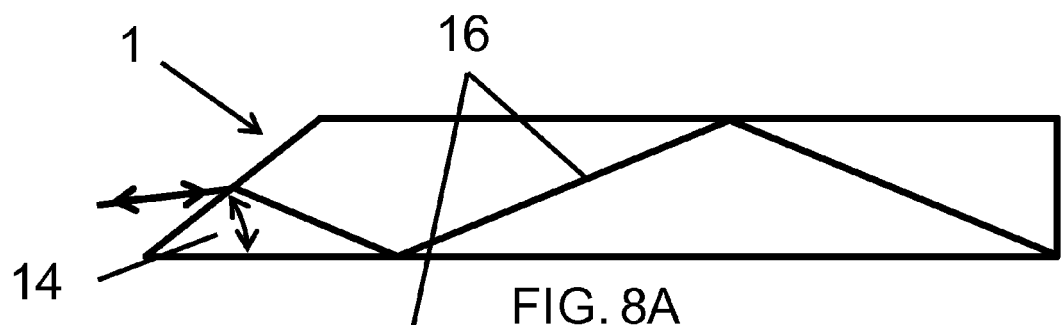
FIGS. 8A and 8B are schematic drawings showing an effect of varying an angle of a wedge at the front of the laser slab in the example embodiment.
Figure 8B:
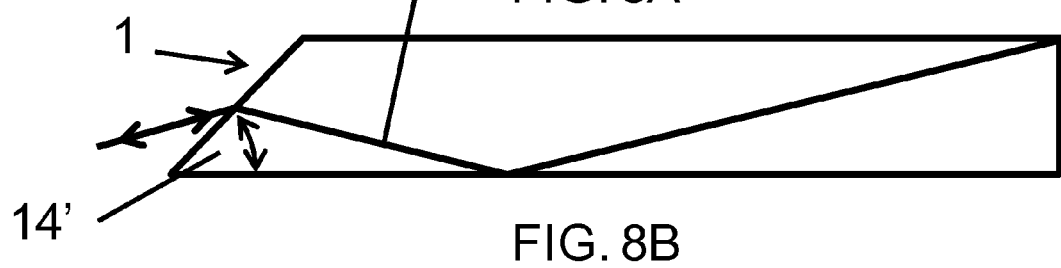

The front wedge angle 14 is not necessarily required to be set to the complement of the Brewster Angle as in the previous figures. As the angle of the wedge changes, the internal reflection angles of the beam 16 inside the slab changes, and the number of reflections for a given total length changes. Two examples of other incident wedge angles that work for the same length and width are shown in FIGS. 8A and 8B. In the first example of FIG. 8A, the wedge angle 14 is 37.6 degrees, and in the second example of FIG. 8B the wedge angle 14' is 46.2 degrees. It is possible to find a slab length that will work for a wide range of angles. In all such cases, however, the incident and exit beams are on top of each other (coincident) in the opposite directions.

Figure 9:
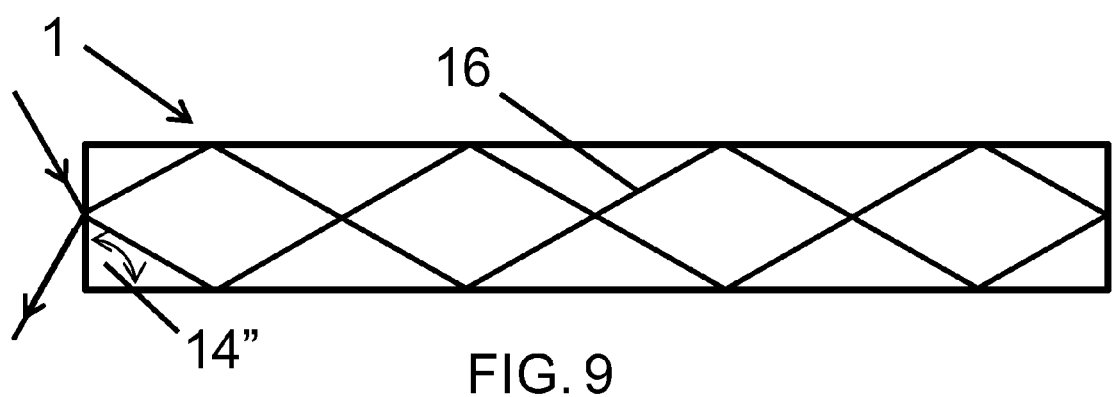
FIG. 9 is a schematic drawing of an example arrangement for providing an entrance and an exit beam in different directions beam for the example embodiment.

However, there is a range of angles near 90 degrees which can also be used. One such condition is shown in FIG. 9, where the front surface angle 14" is at 90 degrees relative to the slab axis. For the solutions around this angle, the exit beam and the entrance beam are not aligned. This has the good feature of separating the input and output beam 16. However, the area of the front surface is at a minimum compared to other wedge angles 14 and 14', and this limits the power density of the amplified light.

Figure 10A:
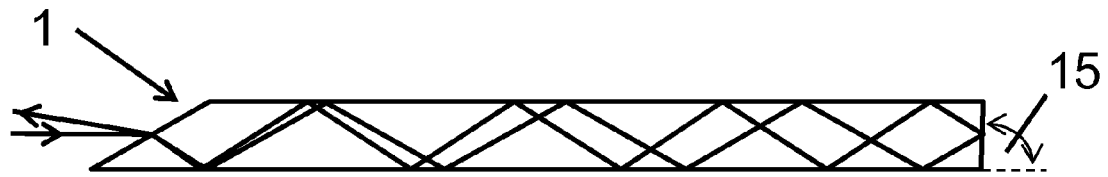
FIGS. 10A and 10B are schematic drawings showing example separation of the exit beam from the entrance beam by varying the angle of an end reflecting surface in the example embodiment.
Figure 10B:
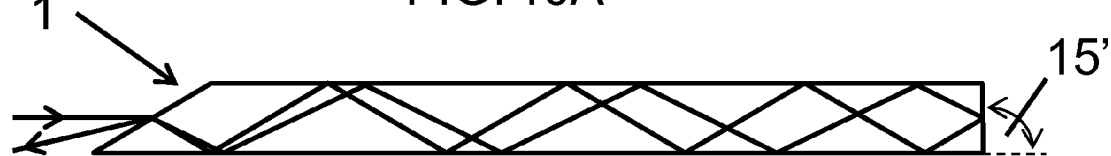

Finally, preferred example embodiments provide for the reflecting surface at the end of the slab to be at an angle different than 90 degrees. This is shown in FIGS. 10A, 10B for two example angles 15 and 15'. In the first example of FIG. 10A, the end angle 15 is at 88.25 degrees, and this results in the exit beam being separated by 9.41 degrees from the on axis input beam. In the second example of FIG. 10B, the angle 15' is 91.80 degrees, and the exit beam is separated by 13.50 degrees from the input beam. Other angles can be used depending upon the ratio of slab length to slab width, and these two are only shown as examples. This configuration has the desirable features of separating the input and exit beams and allowing for the full aperture to be filled with the incident beam.

Figure 11:
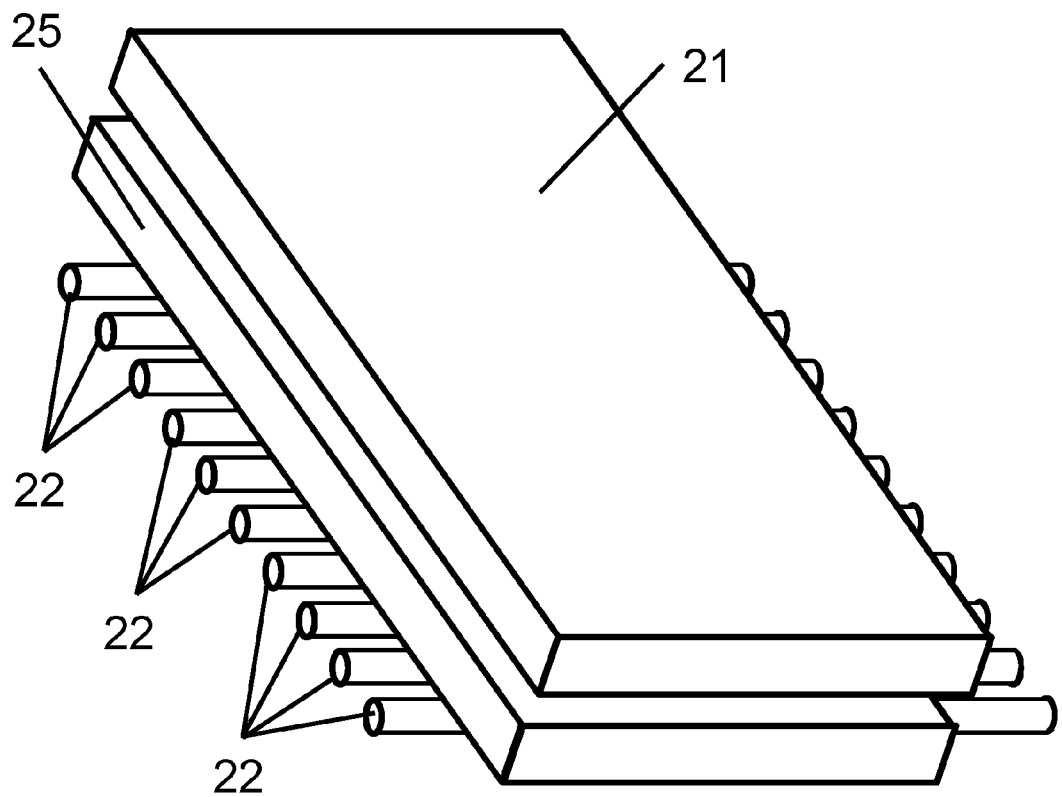
FIG. 11 is a schematic drawing showing an interior structure of one section of an example amplifier chain using a large slab laser crystal and adding more pump lamps.

Another example design using the same materials and general arrangement discussed above but with a slightly different architecture is partially shown in FIG. 11. This variation would permit scaling to much higher power levels. In this example, there is one row of lamps 22 provided on only one side of the gain crystal 21, and there are more of them. Instead of three lamps on the one side for the presented four cm wide crystal example in FIGS. 1-4, there could be up to 24 lamps for a 30 cm long crystal, for example. Also the crystal axis is laterally rotated such that the B axis is along the 30 cm dimension. Also shown is a single cavity filter slab 25 that lies between the pump lamps 22 and the laser gain material 21.

Figure 12:
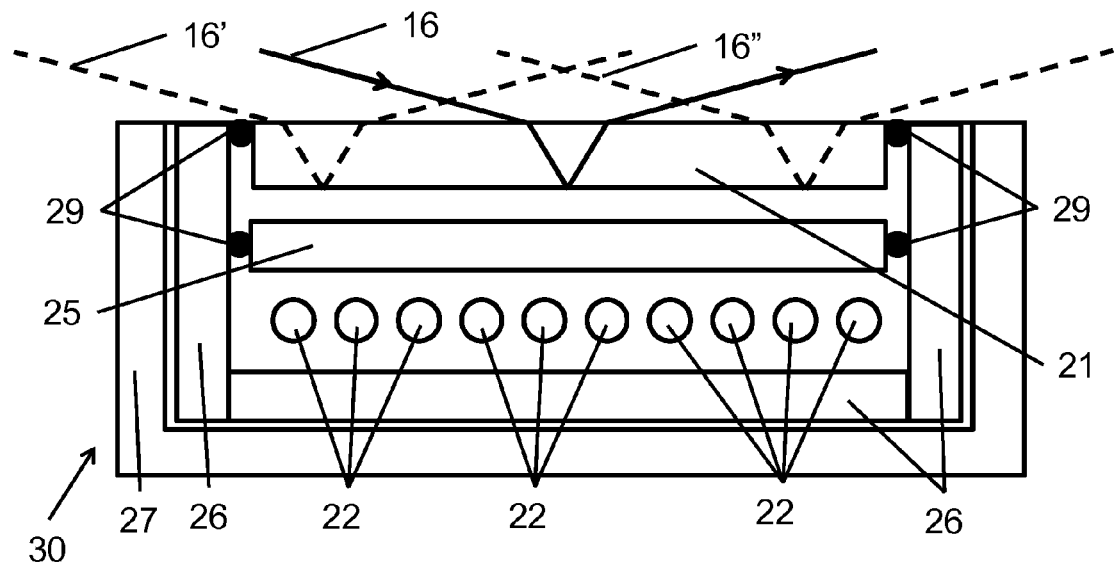
FIG. 12 is a schematic drawing showing a cross section of one of the amplifiers in a chain showing how the laser beam enters and exits the gain material.

FIG. 12 shows a cross section of the example of one of the segments 30 of an example laser amplifier chain, where the segment 30 incorporates the structure in FIG. 11. This figure shows the laser amplifier slab 21, the cavity filter slab 25, and the array of pump lamps 22. Also shown is the ceramic cavity reflector 26 which covers only one side of the amplifier slab 21, and a stainless steel case 27. The cavity reflector 26 is designed to reflect the light (radiation) from the lamps 22 back into the device to be utilized. This reflector 26 is preferably made of an inert (thermally, chemically, and radiation) substance, such as a high alumina ceramic, for example. The gaps between the amplifier slab 21 and the cavity filter 25 allows for the passage of cooling water as before, and the space around the pump lamps 22 also allows for a separate circuit of cooling water. The slabs are held in place by seals 29 that keep the water circuits separate and allow for the thermal expansion of the parts as the temperature increases.

Also shown in FIG. 12 is the path of the amplified laser beam. The center of the beam is shown by a solid line 16 as it impinges on the surface of the gain crystal 21 at the Brewster Angle. The beam refracts (changes angle) as it crosses the surface, is totally reflected off the back surface, and exits at the Brewster Angle. The beam is wide, as indicated by the dashed lines 16' and 16" and traverses through the gain medium twice (in and out).

Figure 13:
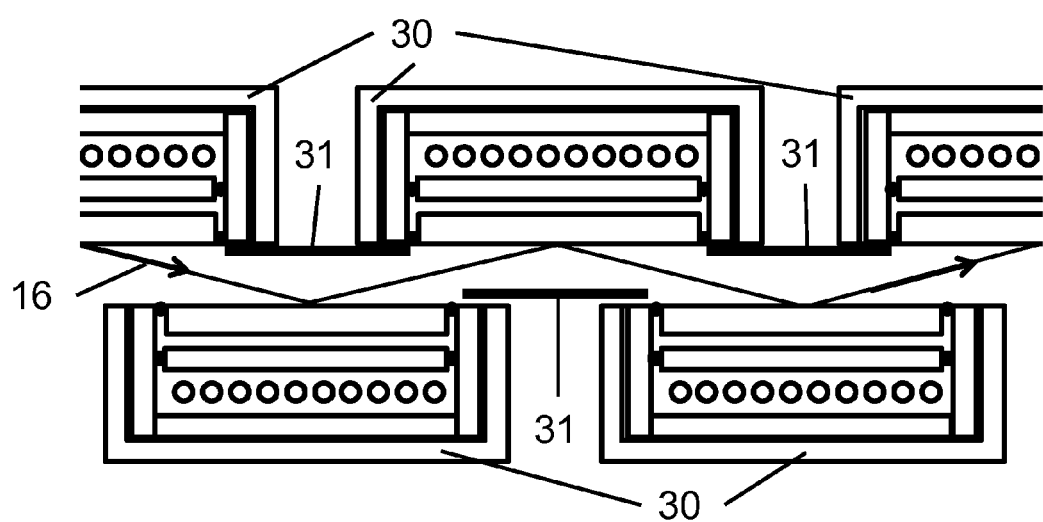
FIG. 13 is a schematic drawing showing an example of combining a plurality of the amplifiers of FIG. 12 in series to provide very high laser output powers.

FIG. 13 shows how the amplifier stages 30 could be combined into an amplifier chain to result in an amplified beam of extremely high power. The laser beam 16 alternately passes through each one of the amplifier stages 30 on each side of the beam path. Between each amplifier stage, there is a reflecting surface 31 which traps the pump lamp photons in a cavity until they are absorbed by the laser gain material.

At the lower power levels, the laser amplifier could be constructed using the example lasers discussed with respect to FIGS. 1-4. As the power level increases along the amplifier chain, the amplifiers could change in design to the example configuration shown in FIGS. 11-13. The result is a very high power beam at higher efficiencies than previously possible, up to power handling limit of the exemplified gain materials grown via the HEM method. The laser beam is expanded in cross section so this architecture presents a large surface area slab for the beam to interact with. The size of the head is limited only by the size of the HEM furnace producing the boule, from which the slab crystal is cut. For example, if this configuration is made in a 15 cm high by 30 cm long active slab that is 1 cm thick, utilizing a beam cross section of ~15 cm×15 cm, it would generate a beam with an enormous amount of peak and average power in a simple and relatively small device.

However, even if a larger slab amplifier crystal is assembled via the described methods such as diffusion bonding, the optimum pump lamp size is likely limited to ~15 cm in length or 6 Kilowatts of power for 6 mm diameter 2 mm bore envelopes. This limit is due to the 20% heat deposited in the electrodes (corresponding to 10% each end if operated on an AC waveform input). The electrode acting as an Anode gets the heat deposition, which occurs on each half cycle. This heat load is manageable in 6 mm diameter quartz tube with a long life. Different dimensions will have different heat removal characteristics and hence different lifetimes. If this pump lamp power and length is chosen to be used with larger slab crystals, then the lamp would be constructed with the electrode sections entering at 90 degree arms with the 15 cm arc section between them in an abbreviated "U" configuration. This type of lamp would be mounted in staggered parallel sockets through the back reflector such that rows shown in FIG. 11 would be replaced with arrays. The arrangement could be such as to achieve uniform pump light intensity with either Thallium Iodide or Mercury arc lamps used with either Alexandrite (Mercury lamp) or Titanium Sapphire (Thallium Iodide lamp) laser slabs.

Alternate Materials

A variation of the above described designs is to use Thallium Iodide along with Mercury as the fill in the arc lamp (this changes the spectrum of the pump light, reference U.S. Pat. No. 7,061,182 that is incorporated by reference, which if modified to include cooling capability and have higher power loading, could be used as the pump light source to provide a longer lifetime at the cost of lower efficiencies). Another option is to use Indium Iodide as the fill inside the sapphire lamps with the Titanium doped sapphire (Ti: $Al_2O_3$) as the laser slab gain medium. In the case where Indium Iodide lamp is used, a cavity filter would also be desirable for use as the lamp produces UV light. A cavity filter could be avoided for this (Hg/Ar+Thallium Iodide) configuration, since the lamp has an output of 71% at mostly 535 nm. This is a band which is almost at the peak of the Ti: $Al_2O_3$ absorption band.

While this configuration would probably not support being used as an oscillator, this configuration would lend itself to being used as a practical amplifier. It would still be less efficient than the Alexandrite amplifier as the fluorescent decay time is approximately twenty five times longer (e.g., 75 microseconds vs. 3.2 microseconds) in Alexandrite at a temperature of 180 degrees Celsius compared to the Titanium Sapphire gain material. However if the designer needed to operate at longer frequencies than the Alexandrite, the Ti:$Al_2O_3$ system would be able to do so.

Applications

One of the several important uses of high power lasers is in Pulsed Laser Deposition (PLD). If high repetition rate Q-switched pulses (these pulses are created using one of several commercially available external switching devices applied to the example lasers discussed in this disclosure) are directed at sputter targets, then discrete layers of any atomic species or compound can be transferred to a substrate making a structured micro layered device. An improvement over even High power PLD would be the use of both versions of this laser in the target vaporization use for PLD. In this example the highest average power laser (e.g., Alexandrite producing high radiance Q switched pulses at approximately 13,333 Hz) could be used to remove target material at a high rate. A second beam at a higher repetition rate (e.g., 312.5 kHz) from a Titanium laser operated as an ultra-fast laser is directed at the in-transit plume of ionic atomic deposition material. This double laser use would greatly improve the quality of the produced films as any ejected particulate matter would be completely converted to atomic ionized matter by the second laser.

This represents a spectrum of manufacturing technologies that at one end is referred to as additive manufacturing where deposition takes place and at the other removal or subtractive manufacturing takes place with the combination constituting a complete process. A large scale example would be PLD plasma spraying of exotic and previously difficult, if not unmanufacturable, compounds, such as Hafnium Tantalum Carbide—the highest melting point material on Earth—onto an expansion matched material such as an Iron Nickel alloy attachment stub, such as Kovar to build up a specific shape with or without a structured inner architecture, perhaps for cooling, then to remove a specific amount to achieve a net shaped part. Such a device would be suitable for hypersonic vehicle control surfaces either on the vehicle's wing or in the plasma plume of the exhaust. An extension of this same technology and materials would be reusable heat shield vehicle skin materials, which would be lighter and stronger than current materials combinations. At the microscopic level of this same technology would be the PLD deposition of layers of semiconductor materials with subsequent removal of specific areas with subsequent deposition of other semiconductor materials to make a device. An illustrative example would be to manufacture diode laser boules with which to make inexpensive diode lasers as one example. This would be representative of Micro-electronic circuit or Micro Electro Mechanical devices or MEMs, as this high power pulsed laser technology when used in conjunction with frequency or harmonic conversion devices, would permit generation of previously unheard of power levels in short frequency portions of the spectrum, thereby permitting direct microelectronic device manufacture. This technology would be particularly useful for manufacturing Diamond-Like Carbon (DCL)-Microelectronic devices as another example. A further example is the depositing of a Boron Arsenide material as a heat spreader material for semiconductor heat control. In this area of application this laser could also be used as an enhanced ion emitter for very high speed molecular beam epitaxy manufacturing machines. This would be in addition to or replacement of the high voltage ion source guns in commercially available machines. In this example application the use of the Q switched source and the mode locked source (options utilizing nanosecond length pulses, and even picosecond or less pulse lengths acting on the ion source then the ion beam for super atomization would achieve beam currents that would be limited only by the target devices boules ability to accrete the deposited ions into a usable structure rather than being an inherent deposition thickness limit such as 1-10 microns per hour to millimeter or centimeter per hour thicknesses.

One example would be to deposit a Diamond-Like Carbon (DLC) coating (or to deposit actual diamond coatings) on any metal mechanical substrate using the laser or a dual laser. DLC layers have at least four features that make them important for commercial applications. First, DLC has the desirable feature of being extremely hard, and a surface that is coated with DLC will virtually never show any wear. Second, DLC layers have very high thermal conductivity (several times higher than copper) which make them ideal for use as thermal spreaders to remove heat from any surface to which it is attached. Third, DLC layers are electrically insulating and have very high breakdown voltage (~10,000 volts per micron thickness). Fourth DLC has a very low coefficient of thermal expansion, permitting its use as a substrate for fabricating integrated circuits and microelectronic devices with extremely high operating power as the DLC would conduct the heat of operation away from compact monolithic stacked circuit structures. Thus, they can be used to provide effective electrical insulation with relatively thin layers or thick wafers/slabs and stacked monolithic architectured blocks for use in many high voltage or otherwise high electric field density applications, including electrical capacitors for energy storage.

DLC insulation applied to copper or aluminum wire used in manufacture of various products would permit a DLC insulated device to operate at higher temperatures than are possible with polymer insulation materials. The operating temperature limit for conventional polymer-insulated wire devices is about 200 degrees C. By comparison, the DLC coating would function up to its graphitization temperature which begins near 400 degrees C. The combination of DLC's thermal conductivity, very low coefficient of thermal expansion, and voltage insulation permits devices to be built that are several times smaller in physical size than their polymer insulated counterparts and yet would still operate at the same power levels.

DLC coatings created by Pulsed Laser Deposition (PLD) (where the sputter target is graphite or pure carbon), have been demonstrated on small samples, but the barrier to larger scale commercial applications has been the lack of availability of low cost, higher power lasers like the slab laser disclosed herein. One implementation is to use the Alexandrite and or Titanium laser, such as of a design disclosed herein, to produce high average power Q switch and or ultrafast pulses being directed at the donor sputter target, with a Titanium Sapphire version producing about 312,500 KHz or greater pulse speeds being used at the same time and being directed at the plume (thus super pulverizing, atomizing and ionizing it) while it is in flight to the substrate. This method can be used for any sputter material, and is not limited to graphite as source material.

Another useful commercial application is in the production of low cost solar cells or integrated circuits by PLD. Virtually any material can be deposited on any substrate in any order and thickness with computer controlled deposition and removal of atomic amounts large or small of deposited material. The barrier to commercial applications has been the availability of a low cost high power laser source. Any of the lasers disclosed herein can be used to enable the economical high speed generation of high efficiency multi-layer PV (photo-voltaic) films such as Silicon, Germanium, Gallium Arsenide on Germanium, Gallium Nitride, Gallium Indium Nitride, Gallium Phosphide or any other Gallium Alloy. Included is the claim that any existing semiconductor alloy currently in existence that has been produced by sputtering. Chemical Vapor or ion deposition on any substrate material can be produced with the described laser system or dual laser systems. This technology which would include the high speed large area manufacture of Graphene—a one atom thick sheet of Carbon atoms in single layer or multiple layer configurations grown into a specific shape part.

Since PLD has the lowest deposition temperature, it is now possible that PV films can be grown on suitable thermoplastic fabric or foil surfaces. This would provide a path for flexible PV arrays at low manufacturing cost compared to conventional MOCVD (metal organic chemical vapor deposition) methods.

High power lasers have a number of applications in the areas of welding and/or cutting. The Q switched version of the slab laser would permit steel plates to be cut that are several to tens of inches thick at accelerated speeds. 20 kW $CO_2$ lasers are currently being used in shipyards, but 100 kW lasers are rare and very expensive. This would not likely be the case for the slab laser systems as disclosed herein, which can be made more economically. A system made up of a series of laser amplifiers, such as the examples provided in this disclosure, could deliver several magnitudes of this power at much reduced operating costs, compared to other megawatt class laser systems.

A single or combination laser source such as the described pulsed and or continuous wave (such as exemplified by 8,220, 0965) used in conjunction as a high powered laser system can also be used for tunneling and/or underground excavation. The use of a continuous and/or Q switched pulse train beam as a combined architecture, would permit slicing the rock face of a target excavation into thick vertical slabs. If a rectangular section under the slices were to be excavated for the use of an articulated conveyor belt material removal system, and then the cutting beam were to then be directed horizontally several feet above this space on each vertical slice then after the horizontal slices were made then the weight of the slabs of rock, would at some point break the rock free to fall onto an articulated conveyor belt system. It is possible for a 1 megawatt beam by virtue of vaporizing a 1 inch diameter hole into 22 feet of rock in about one second, to remove a 10 meter by 10 meter by one meter "panel" of rock in an hour or so, with conveyor belt mucking systems. Compact 5 megawatt systems are feasible in heavy truck mounted architectures. This would represent a 25-50 time improvement in tunneling speed.

The pulse length of the lasers can be important to their application. The longer a pulse length of a laser, the more likely that the material being vaporized will contain undesirable particles in the plume. This may happen even with pulses that are several billionths, or nanoseconds, long. However, as one approaches a trillionth of a second long pulse, the atomic relaxation time is approached and this tends to limit the ability of the material to transfer heat energy to adjacent atoms, thus clumps tend to not cool enough to permit accretion and this enhances atomization and reduces particle contamination. That is one reason an explosive can be machined with an ultrafast system and not with a Q-Switched system, with an ultrashort or ultrafast pulse the heat of vaporization leaves with the plume.

Hence, there is interest in pulses which are shorter than 1 picosecond and which are called ultrafast. The typical pulse length from a Titanium Sapphire system is 100 femtoseconds, and such systems have produced pulses that are as short as 100 attoseconds long.

When a substance is vaporized with the shorter laser pulses, there are fewer particles for the designer to deal with, which makes for a better thin film and a simpler process. This feature is why these MOPA designs would be useful in integrated circuit and Micro Electronic Mechanical systems manufacture. Particularly interesting is DLC substrate and diamond semiconductor integrated circuit manufacture using these laser designs.

The problem with making these short pulses is that for such a short pulse traversing a gain material, 1) the short pulse does not spend enough time interacting with the charged atom to induce it to give up much of the stored energy; 2) A system for producing such ultrafast pulses typically requires one large (20 mm dia. by 6 mm long) crystal that redirects the short pulse through it about 8 to 20 times to actually get the desired energy out of it; and 3) when the desired energy is obtained, the brightness is quite high which could destroy the surface of the optics. Consider the radiance of a 1 joule pulse that is one trillionth of a second long, this would produce a trillion watt radiance. The power scaling law for damage thresholds is the ½ power or square root of the pulse length difference, on that basis a 5 GW/cm radiance level for a 1 ns long pulse, would withstand, e.g., 156 MW for a 1 picosecond long pulse. This pulse length is, e.g., about 1000 times shorter, hence the square root of 1000=31.62, the example radiance and energy level would be, e.g., one trillion watts at 1 joule, thus the new damage threshold would be, e.g., 1/31.62=0.03162 joules.

That is why in traditional ultrafast systems, the actual pulse length is about ½ a nanosecond long and is compressed in a grating pair so as to chirp or spectrally overlap the spectral components. That brings up another problem with ultrafast amplifiers: the speed of light is usually different for different colors in most optical materials, which leads to "dispersion" where the 500 picosecond blue section travels slower than the 500 picosecond red section of the pulse itself. This is one of the most important reasons the average power output of most systems is limited for ultrafast systems and is typically provided under 100 watts. An example state of the art system costs $300 k, is cooled with liquid nitrogen, and needs a Q switched, frequency doubled pump laser that is 5 times more powerful to get the 100 watts in order to drive it, thus producing a system that is, e.g., about $500 k. In contrast, the cost to get 3,600 watts out of the disclosed Ti Sapphire amplifier is in the order of, e.g., about $100,000 at the time of this writing. The reason that the manufacturer made the described 100 watt ultrafast system was that it did produce science, of which films of interest were made that Metal Oxide Chemical Vapor Deposition (MOCVD) could not.

However, a solid state pulse compression technology based on directing a dispersed pulse through a series of high refractive index glass prisms that are arrayed in an antiparallel configuration could be utilized to correct this problem. By sending a pulse through the tip of each prism, the physical distance is longer for the slower waveform (higher frequency) through the glass and shorter for the faster waveform (lower frequency) the path length difference in air verses glass allows the slow frequency to be compensated by this strategy so it is back where it positionally was in the pulse, as it entered the amplifier. This architecture provides a stack that has a mirror at the end of the beam path such that the light is bounced back through the prism stack. These stacked prisms can be provided about the size of an amplifier head or longer, which is useful to provide a dispersion compensation head or heads next to the actual power head or heads.

Example Application System

Figure 14:
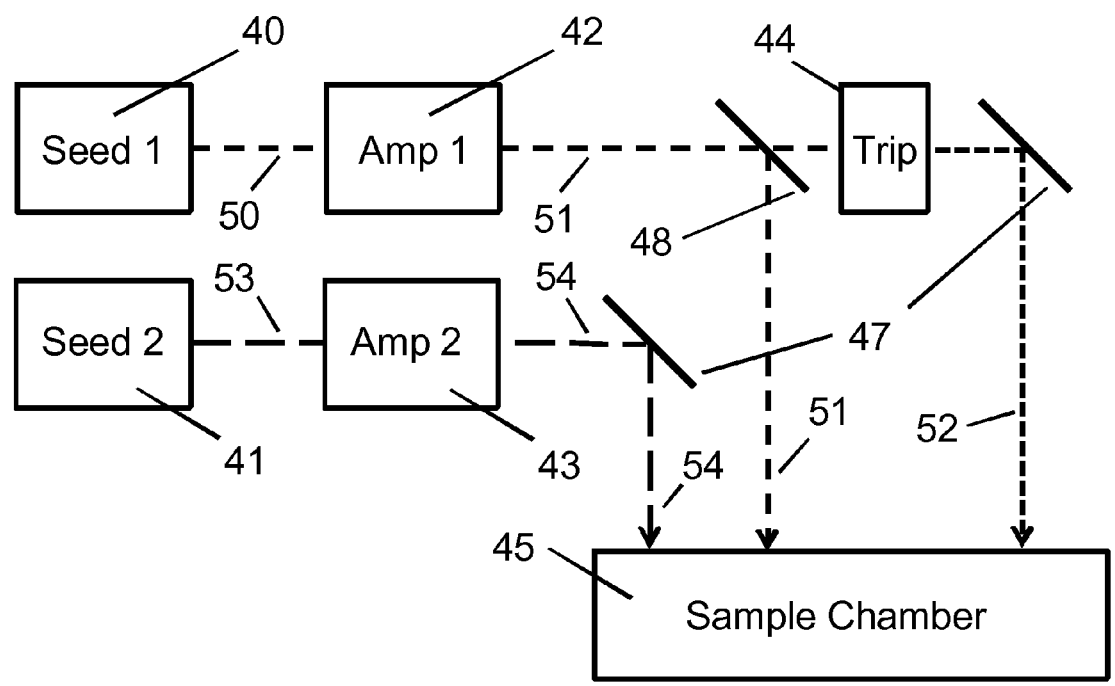
FIG. 14 is a schematic drawing showing an example arrangement for manufacturing components using one or more slab lasers.

To illustrate how these components work and how they might be used, FIG. 14 shows a pulse from the source in a first seed laser 40 through the amplifier 42 and mirrors 48, 47 to its end point in the process chamber 45 and then we will repeat this for a second seed laser 41. The first seed laser 40 acts as a seed for the ultrafast amplifier chain 42. The pulse-length frequency and repetition rate is defined in this component according to the desired application. For example, it can produce a ½ nanosecond pulse, with this pulse having, e.g., a 100 nm wide bandwidth 750 nm to 850 nm, with pulses of, e.g., 312,500 per second being emitted. Alternatively, the fluorescence output bandwidth of Titanium Sapphire produces light from 650 nm to 1100 nm at the same rates as mentioned, allowing operation of the laser at those frequencies, where desirable.

The amplifier chain can comprise of a series array of amplifier modules such as shown in FIG. 1 for an example module, where the pulse is introduced into the gain crystal of Titanium Sapphire, as shown in FIGS. 2 & 10A and 10B. The laser beam propagates from face to face (FIGS. 10A & 10B) as it traverses the crystal from end to end and back again, though it will enter and exit at different angles for separation purposes, it is being amplified and dispersed because the speed of light for the red component is faster than the blue component. This causes those sections which are each still ½ ns long, to be delayed relative to each other and effectively lengthens the pulse. Upon exiting the first slab, the pulse can be directed into a dispersion compensator or compressor, (described below) which will reverse the displacement effect of the gain crystal such that the now amplified pulse is back to being ½ ns long. This is repeated for each amplification stage until the desired power level is reached, at which point the pulse is compressed with the same kind and design of compensator but the architecture and size is perhaps larger to accommodate the higher energy levels.

The compression device can be built to produce a pulse that is 5,000 times shorter by a process called chirping. This is where the blue and red sections are translated in time such that they partially extremely overlap and portions of the tail and leading edges of the different colors have been separated such that they destructively interfere, this effect leaves the un overlapped section in the center of the pulse that is at the 1 picosecond length level but does not decrease the energy content of the pulse.

Figure 15:
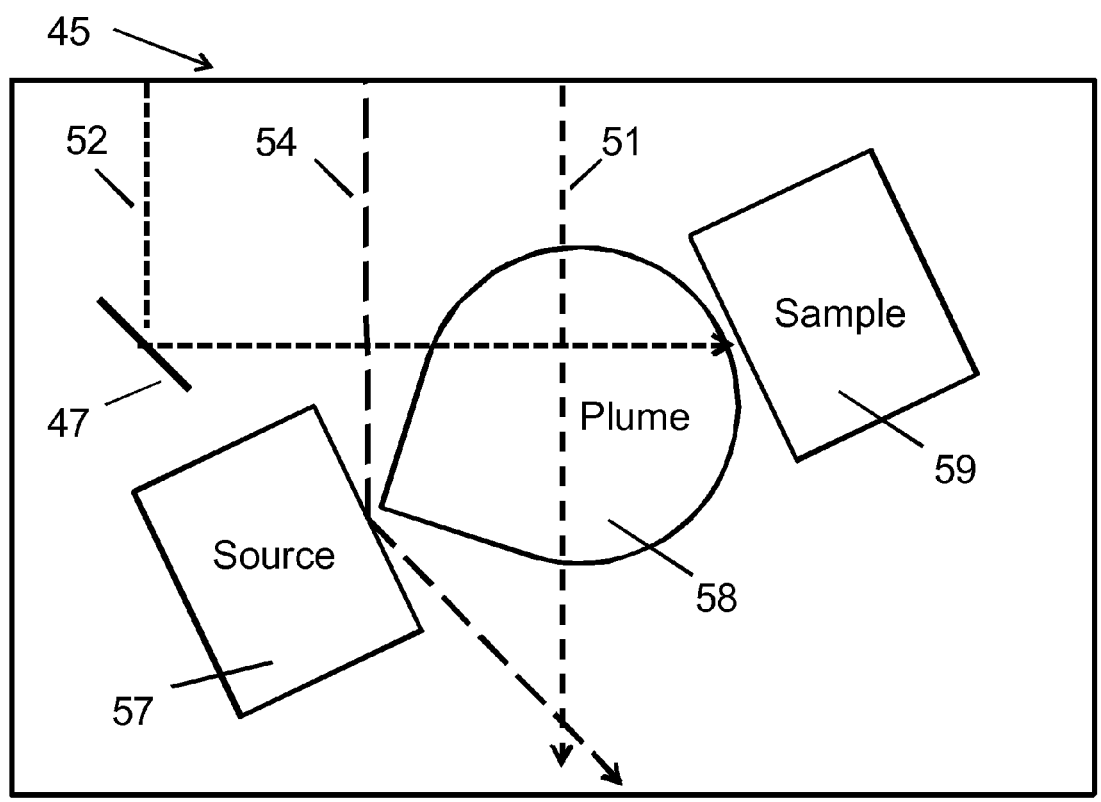
FIG. 15 is a schematic drawing showing an example sample setup for the example arrangement of FIG. 14.

Referring again to FIG. 14, the final compression stage would be located in the first amplifier 42 housing at the end of an included amplifier chain to output beam 51. The emitted beam 51 would proceed to the first beam splitter 48, where a portion 51' of the ultrafast pulse energy would be reflected down to the process or sample chamber 45 to thermalize a substance into the particles in the plume 58 of FIG. 15. The other portion of beam 51 transmitting through the splitter 45 enters the tripler module 44, where a fraction of the pulse energy is converted, e.g., into photons of ⅓ wavelength or 266 nm. These photons and this portion of the pulse is directed onto turning mirror 47, where the 1 picosecond 266 nm light pulse 52, is directed onto the sample being coated in the sample chamber 45, as shown in FIG. 15 sample 59. This is where the UV photons displace electrons from the surface of the sample 59 and photo-ionize the surface, thus enhancing the coating quality and speed. In the second Alexandrite amplifier chain shown in FIG. 14, second seed laser 41 generates a beam 53 with, e.g., a 50 ns long pulse that has up to 100 nm bandwidth, at a rate of 13,333 pulses per second (pulse width, repetition rate and bandwidth are chosen by coating engineer to optimize process). This beam 53 is directed into the amplifier chain 43, where the pulse is increased in energy content and exits the amplifier chain 43 via beam path 54 to another mirror 47, where it is directed onto the source material in the sample chamber 45. The source sample 57 is shown in FIG. 15, which is to be vaporized and become the atomized plume 58.

This laser pulse train in beam 54 does not necessarily have to be compressed, as this effect does not work well on pulses that are longer than 600 picoseconds. The dispersion in the Alexandrite gain material does not markedly affect the pulse length and this beam only has to reach the desired power level to be effective at vaporizing the material at the source. Different materials will require different length pulses to optimize this effect which is set in the seed laser for each amplifier chain and material to be deposited.

Hence, FIG. 14 shows an example component architecture for the layout of a real world PLD laser source generator that incorporates both the Alexandrite MOPA and the Titanium Sapphire MOPA systems described herein. Each has a corresponding seed laser or Master oscillator, 40, 41, which can be a Ti Sapphire and an Alexandrite master oscillator, respectively. A master oscillator defines the coherence length, pulse frequency, pulse length and repetition rate for each amplifier chain. Therefor seed 40 is the ultrafast seed laser, which would produce approximately ½ nanosecond (or less) pulses with about 100 nm bandwidth (750 nm-850 nm) (or a narrower bandwidth) that was, e.g., repeated about every 3.2 μs (or less) or 312,500 times per second (or more). It would most likely be mode locked in (a method of producing very short duration very coherent seed pulse) in order to achieve these short pulses.

Similarly, seed 41, would be a source for the Alexandrite amplifier chain 43, and it would produce Q switched, e.g., 50 ns+/−20 ns pulses with a 100 nm or less bandwidth, every, e.g., 75 μs or 13,333 times per second. The bandwidth is a desirable feature for an ultrafast laser, as the pulse length is compressed up to 6000 times by overlapping the spectral components of the blue components and the red components to destructively interfere in the timeframe of each individual pulse. This effect is possible because of the coherence length of the seed pulse (in which the peaks and valleys of the photon's amplitude waves are lined up like marching soldiers).

There is a correlated frequent need to exploit atomic level characteristics in PLD manufacturing; one of these features is to enhance the likelihood of the vaporized atoms in the plume in to wanting to attract and adhere to each other in structured order on the substrate being coated. This is the reason a designer would very frequently want to include the ability to encourage those atoms to do so by creating short wavelength photons from frequency converted portions of the amplified laser. This is accomplished in the tripler 44. This device is a cluster of harmonic frequency conversion crystals in a holder that converts a portion of the chosen beam to become 266 nm photons. The unused portion of that beam 51, which is primarily reflected from beam splitter 48, is directed onto the plume so as to thermalize the atoms and particles that are in transit from the ion source to the substrate being coated.

The reason the higher portion of the ultrafast laser is used for this purpose is the take advantage of the 25 times or higher repetition rate of the Titanium laser and to create only enough photoionization events via irradiation by the UV beam 52, to enhance accretion at the surface and organization into a structured film (such as would be needed for Gallium Nitride structures) of the desired regions of the substrate being coated (specifically large areas or trace lines in cases of extreme finesse). In the coating chamber illustrated in FIG. 15, Beam 52 is the photo-ionizing, e.g., 266 nm ultraviolet beam portion illuminating the sample 59. The larger portion that thermalizes or atomizes the plume 58 is via beam 51, and the higher average power, lower repetition rate Alexandrite beam 54 is illuminating the ion source 57. The particulars of optimization via angles of incidence irradiance levels on plume, source and substrate are within the film engineer's discretion. All of these parameters are variable by changing the characteristics of the seed lasers and chamber vacuum or partial atmosphere of choice partial pressure.

Hence, an approach as shown in FIGS. 14 and 15 can be utilized for semiconductor manufacture (doping and/or depositing layers on semiconductor substrates as workpieces) or to coat various workpiece items with desirable materials, such as diamond or DLC.

A real world architecture that exploits the high efficiency and power generating capability of the laser amplifiers described above, for example in an architecture called a MOPA (which stands for Master Oscillator Power Amplifier), is described in more detail in this section.

Each type of gain crystal—Chromium Doped Chrysoberyl also known as Alexandrite and Titanium doped Sapphire—operates at, and is provided with, a separate Master Oscillator for each type of laser and associated amplifier beam train. Each type of gain material has characteristics that favor generation of complimentary pulse lengths and energy levels. The Alexandrite MOPA is best utilized generating, e.g., 1-200 nanosecond long pulses, often called Q Switched, in its repetitive pulse train, whereas the Titanium Sapphire MPOA preferentially generates sub-nanosecond pulse lengths that would be suitable for compression to the sub picosecond pulse lengths, often called ultrafast. Anti-parallel grating compression or Active mirror prism compression systems would be utilized. Alternately, a Stimulated Brillion Scattering mirror could be used with the compression prisms such that wavefront distortions would be corrected simultaneously.

To exploit this design's capabilities, a PLD system designer could utilize the two different types of lasers described herein in the same coater system. Each type of laser is tunable, so within a standard mirror coating bandwidth, which is typically ±10% of the centerline frequency, both could easily operate at separate but distinct output frequencies that both would produce polarized outputs. High reflectivity polarization beam splitters or mirrors would be used to combine or separate both beams—most likely at the source.

The Titanium Sapphire crystal has a fluorescence lifetime that is, e.g., about 3.2 μs vs. the Alexandrite that at typical amplifier design system operating temperature, is, e.g., about 75 μs though it does have a fluorescence lifetime that ranges from, e.g., 1.5 milliseconds at subfreezing temperatures to, e.g., 75 μs at 150 degrees Centigrade. This relates to output power and extraction efficiency as the emission cross section changes for Alexandrite at different temperatures. If a gain medium is charged to saturation, a designer can extract a pulse and recharge the gain crystal within this time frame or faster. Ti Sapphire lasers are typically pumped, e.g., with 5-200 ns though the average is 50 ns+/−20 ns, green laser pulses and often the gain section of the Ti Sapphire crystal is saturated so it becomes super radiant.

This means the gain crystal will produce a much shorter pulse (~2-5 ns) without any special approach, like adding a Q switch and associated electronics. Alternately if you want much longer pulses such as in welders that are milliseconds long, pump energy should be added at a rate sufficient to charge the gain material over multiples of that fluorescence timeframe, so in fact they are being run at quasi-CW during the pulse.

The disclosed design takes advantage of the fact that amplifiers don't need to be charged or pumped to levels that would allow them to run as oscillators, though the Alexandrite device could operate as an oscillator, if desired. The lasers are just charged at whatever level the lamps (in the disclosed design) will permit—but because the lamp emission is used as efficiently as disclosed, the amplifiers can have a pulse sent through them to extract that stored energy between the fluorescent timeframe.

One can actually run higher repetition rate pulse trains through Alexandrite, but in such a case one will have to carefully consider the stimulated emission cross section, which is more favorable for Titanium producing high gain very short pulses as opposed to Alexandrite favoring the production of longer nanosecond pulses in pulse trains. However this exact specification is at the designer's discretion. This feature makes it possible to 650 nm diode laser pump a small Alexandrite slab as either a Q Switched, or a Mode locked and Q Switched seed oscillator, such as shown, for example, in the arrangement of FIG. 14, items 42 & 43. Seed master oscillators for either the Alexandrite or the Titanium Sapphire amplifier chains are shown by items 40 & 41 in FIG. 14.

The real world PLD system design will direct the ultrafast and/or Q switched pulse trains onto the plume (FIG. 15 item 51) and perhaps have a Portion of said beam or beams up converted, in harmonic generators, (FIG. 14 item 44) to reach the short wave UV spectrum so that a designer will have the option to direct the optical power levels and frequencies of interest upon and irradiate the intended plume and or substrate (FIG. 15 items 51 & 54) such that the atomic clumps or particles will be atomized and, ionized or removed and the surface of the substrate being coated will also be photo ionized (and have electrons knocked off) such that this state will increase the accretion rate and structured atomic assembly.

The table below shows an example operating configuration for various applications of the disclosed lasers.

TABLE 1

| Laser Type/Application | Pulse length | Harmonic Conversion | Comments |
| --- | --- | --- | --- |
| Alexandrite = Alex Ti-Sapphire = Ti | 1 ns-200 ns 0.05-0.6 ns + Compression to <1 picosecond | One or both lasers have all or portion of output up converted to ~400 nm & or 266 nm | Better quality with 266 nm on substrate & Al booster atomizing pulse on plume in most cases. |
| DLC | Alex; ~50 ns, Ti: ~1 ps | Alex: 800 nm, Ti: 266 nm | |
| Semiconductors | Alex; ~50 ns, Ti: ~1ps | Alex: 800 nm, Ti: 266 nm | |
| Metals | Alex; ~150 ns, Ti: ~1 ps | Alex: 800 nm, Ti: 266 nm | |
| Technical Ceramics | Alex; ~50 ns, Ti: ~1 ps | Alex: 800 nm, Ti: 266 nm | |
| Isotope Separation | Alex: 100 ns | Alex: 400 nm | Large Harmonic powers generated by Brewster |

The temperature dependent emission cross section relates to extraction efficiency, and the damage threshold levels will need to be carefully designed and kept to levels safely under this limit, as the active gain volume in the design favors very high energy content pulse trains that could cause damage if components in the laser path are damaged or disturbed.

Many other example embodiments can be provided through various combinations of the above described features. Although the embodiments described hereinabove use specific examples and alternatives, it will be understood by those skilled in the art that various additional alternatives may be used and equivalents may be substituted for elements and/or steps described herein, without necessarily deviating from the intended scope of the application. Modifications may be necessary to adapt the embodiments to a particular situation or to particular needs without departing from the intended scope of the application. It is intended that the application not be limited to the particular example implementations and example embodiments described herein, but that the claims be given their broadest reasonable interpretation to cover all novel and non-obvious embodiments, literal or equivalent, disclosed or not, covered thereby.

What is claimed is:

1. A method of manufacturing a workpiece comprising the steps of:
   providing the workpiece;
   providing a laser device comprising:
      a slab crystal;
      a light source providing light energy including an ultraviolet frequency band, and
      a cavity filter material including terbium fluoride doped with samarium, said filler material being provided on at least one side of the slab crystal and adapted for receiving the light energy from the light source, and adapted for converting the light energy at the first ultraviolet frequency band into light energy at a second frequency band of visible light for absorption by the slab crystal for amplifying a laser beam, wherein the slab crystal is adapted to emit the amplified laser beam from an end; and
   using said laser device to emit a laser light to add or remove one or more layers of material to/from the workpiece.

2. The method of claim 1, wherein the workpiece is formed into a semiconductor device.

3. The method of claim 1, wherein the workpiece is formed into a photovoltaic device.

4. The method of claim 1, wherein the workpiece is formed into an integrated circuit.

5. The method of claim 1, wherein the workpiece is formed into a capacitor.

6. The method of claim 5, wherein the workpiece is an electrical conductor including copper and/or aluminum.

7. The method of claim 1, wherein a layer of material including diamond or a diamond-like carbon is added to the workpiece using the laser device.

8. The method of claim 1, wherein a layer of material including Hafnium Tantalum Carbide is added to the semiconductor device using the laser device.

9. A method of manufacturing comprising the steps of:
   providing a slab laser comprising:
      a slab crystal adapted to emit an amplified high-energy pulsed laser beam from an end,
      a light source providing light energy including a first frequency band,
      a cavity filter material provided on at least one side of the slab crystal adapted for receiving at least a portion of the light energy from the light source, and adapted for converting at least part of the light energy at the first frequency band into light energy at a second frequency band for absorption by the slab crystal for amplifying a laser beam, and
      a cooling subsystem adapted for cooling the laser;
   providing a workpiece; and
   using the slab laser to emit the high-energy pulsed beam for depositing one or more layers of a material on the workpiece.

10. The method of claim 9, wherein the material is diamond or a diamond-like carbon.

11. The method of claim 10, wherein the material is Hafnium Tantalum Carbide.

12. A method of manufacturing a semiconductor device comprising the steps of:
   providing a slab laser comprising:
      a slab crystal, adapted to emit an amplified high-energy pulsed laser beam from an end,
      a light source providing light energy including a first frequency band,
      a cavity filter material provided on at least one side of the slab crystal and adapted for receiving at least a portion of the light energy from the light source, and adapted for converting at least part of the light energy at the first frequency band into light energy at a second frequency band for absorption by the slab crystal for amplifying a laser beam, and
      a cooling subsystem adapted for cooling the laser;
   providing a semiconductor workpiece;
   providing a source of carbon; and
   using the slab laser to emit the high-energy beam of very short pulses for depositing one or more layers of diamond or diamond-like carbon on the workpiece from the source of carbon.

13. A method of manufacturing an energy storage device comprising the steps of:
   providing a slab laser comprising:
      a slab crystal, adapted to emit an amplified high-energy laser beam from an end,
      a light source providing light energy including a first frequency band,
      a cavity filter material provided on at least one side of the slab crystal and adapted for receiving at least a portion of the light energy from the light source, and adapted for converting at least part of the light energy at the first frequency band into light energy at a second frequency band for absorption by the slab crystal for amplifying a laser beam, and
      a cooling subsystem adapted for cooling the laser;
   providing a workpiece;
   providing a source of carbon; and
   using the slab laser to emit the high-energy beam for depositing one or more layers of diamond or diamond-like carbon on the workpiece from the source of carbon; and
   incorporating said workpiece in the energy storage device.

14. A system for transferring a material from a first object to a second object, comprising:
   providing a first amplifying subsystem comprising one or more first laser devices, wherein each one of said first laser devices is comprised of a slab laser including:
      a slab crystal, and
      a cavity filter material provided on at least one side of the slab crystal and adapted for receiving light energy from a light source, such that the cavity filter material converts light energy received at a first frequency band into light energy at a second frequency band that is absorbed by the slab crystal, wherein
      the slab crystal is adapted to receive an incident light beam into one end of the slab crystal at one angle and also emits an amplified laser beam from the one end at either an angle different than the one angle or emits the amplified laser beam linearly shifted from the incident light beam after absorbing the light energy at the second frequency;

providing a first seed laser adapted for outputting a first seed laser beam having first desired pulse characteristics for inputting into said first amplifying subsystem for generating a first laser beam output;

providing a second amplifying subsystem comprising one or more second laser devices;

providing a second seed laser adapted for outputting a second seed laser beam having desired pulse characteristics for inputting into said second amplifying subsystem for generating a second laser beam output;

providing a first laser routing subsystem adapted for routing at least a portion of said first laser beam output to the first object to vaporize a portion of the first object, wherein providing a second laser routing subsystem adapted for routing at least a portion of said second laser beam output to the second object to prepare the second object for accepting at least part of the vaporized portion of the first object onto or into the second object.

15. The system of claim 14, wherein said first seed laser is an ultrafast laser having a pulse width of about ½ nanosecond or less and a relatively narrow bandwidth of about 100 nm or less.

16. The system of claim 14, wherein said first seed laser is an ultrafast laser emitting a pulse about every 3.2 µs or less.

17. The system of claim 14, wherein said second seed laser is a Q-switched laser a pulse width of about 1 nanosecond or more.

18. The system of claim 14, wherein said first laser routing subsystem is further adapted for routing another portion of said first laser beam into a plume of the vaporized portion of the first object to thermalize particles of said first object present in said plume to further atomize said plume.

19. The system of claim 14, wherein said one or more second laser devices is comprised of a slab laser including:
a slab crystal, and
a cavity filter material provided on at least one side of the slab crystal and adapted for receiving light energy from a light source, such that the cavity filter material converts light energy received at a first frequency band into light energy at a second frequency band that is absorbed by the slab crystal, wherein
the slab crystal is adapted to receive an incident light beam into one end of the slab crystal at one angle and also emits an amplified laser beam from the one end at either an angle different than the one angle or emits the amplified laser beam linearly shifted from the incident light beam after absorbing the light energy at the second frequency.

20. The system of claim 14, wherein the slab crystal(s) is provided with a back reflecting surface that is not at 90 degrees with respect to the horizontal axis of the slab crystal.

21. The system of claim 14, wherein the reflecting surface(s) includes a silicon dioxide coating or dielectric multi-layer ¼ wavelength stack comprising a tuned or frequency selective behavior for the laser beam but transparent to the pump light.

22. The system of claim 14, wherein the slab crystal is adapted such that the exit laser beam emitted by the slab crystal is separated by some angle or distance from the entrance beam of the light energy from the source.

23. The system of claim 14, wherein the first frequency is at an ultraviolet light frequency and wherein the second frequency is a frequency that is less than ultraviolet light.

24. The system of claim 14, further comprising a plurality of elastic holders adapted for holding components of the device while allowing for thermal expansion of one or more the components of the device.

25. The system of claim 14, wherein the cavity filter material includes terbium fluoride doped with samarium.

26. The system of claim 14, wherein the slab crystal includes chromium doped alexandrite.

27. The system of claim 14, further comprising a coolant circulation system adapted for circulating a coolant in the device for cooling the slab crystal and/or the cavity filter material.

28. The system of claim 14, wherein the one end is provided at an acute angle with respect to one adjoining side of the slab crystal and is provided at an oblique angle with respect to an opposite adjoining side of the slab crystal.

29. The system of claim 14, wherein said first amplifying subsystem, said second amplifying subsystem, or both include at least one compressor or compensator adapted for compensating for differing light speeds in a respective laser beam(s).

30. The system of claim 14, wherein the slab crystal includes Titanium doped Sapphire.

31. The system of claim 14, wherein said one or both of said seed lasers is comprised of a slab laser including:
a slab crystal, and
a cavity filter material provided on at least one side of the slab crystal and adapted for receiving light energy from a light source, such that the cavity filter material converts light energy received at a first frequency band into light energy at a second frequency band that is absorbed by the slab crystal, wherein
the slab crystal is adapted to receive an incident light beam into one end of the slab crystal at one angle and also emits an amplified laser beam from the one end at either an angle different than the one angle or emits the amplified laser beam linearly shifted from the incident light beam after absorbing the light energy at the second frequency.

32. The method of claim 1, wherein the slab crystal includes Titanium doped Sapphire.

33. The method of claim 1, wherein the material includes Boron Arsenide.

34. The system of claim 14, wherein the first object includes Boron Arsenide.

35. The system of claim 14, wherein any one or more of said laser devices includes a slab laser comprising:
a slab crystal having a front face that forms a point provided at an acute angle with respect to a bottom of the slab crystal and adapted for receiving an incident light beam provided at a first angle with respect to said front face, said slab crystal also having a back wall that is provided at a back angle that is not 90 degrees with respect to the bottom of said slab crystal;
a light source providing light energy including a portion in first frequency band and a portion in a second frequency band; and
a cavity filter material transparent to the first light frequency band and that is provided on the top and/or the bottom of the slab crystal adapted for receiving the light energy from the light source, and adapted for converting the light energy at the first frequency band into light energy at a converted frequency band for at least partial absorption by the slab crystal, wherein
the light source and the cavity filter material are arranged such that at least part of the portion of the light energy in the second light frequency band is transmitted through the cavity filter to the slab crystal, and wherein the slab crystal is adapted for amplifying a laser beam for emitting from the slab crystal by absorbing both a portion of the part of the light energy in the second frequency band transmitted through the cavity filter, and by absorbing a portion of the light energy at the converted frequency band, wherein the acute angle and the back angle are chosen such that said amplified laser beam is emitted from the front face of the slab crystal at an angle that is different than said first angle such that said incident light beam entering said slab crystal is not coincident with said amplified laser beam emitted from said slab crystal.

36. The method of claim 1, wherein said slab is a rectangular slab.

37. The method of claim 1, wherein said slab has a length greater than a width, and wherein a plurality of light sources also have a length greater than a width, said light sources being arranged such that a line along the length of the light sources is not parallel to a line along the length of the slab.

38. The method of claim 1, further comprising at least one cavity reflector for reflecting light radiation emitted by one or more light sources into the device.

39. The method of claim 38, wherein said cavity reflector is adapted with at least one channel for receiving coolant from a cooling subsystem for cooling said device.

40. The method of claim 1, further comprising at least one seal for separating one or more cooling channels from each other.

41. The method of claim 38, wherein said at least one seal is provided in contact with a cavity reflector and either the slab or cavity filter material.

42. The method of claim 1, further comprising at least water manifold mounted on a perimeter of said device for supporting a cooling subsystem for cooling said device.

43. The method of claim 1, further comprising at least one manifold mounted on said device for supporting a cooling subsystem for cooling said device.

44. The method of claim 1, wherein said device is adapted such that said slab emits a plurality of laser beams in parallel.

45. The method of claim 9, wherein the slab crystal includes Titanium doped Sapphire.

46. The method of claim 9, wherein the material includes Boron Arsenide.

47. The method of claim 12, wherein the slab crystal includes Titanium doped Sapphire.

48. The method of claim 12, wherein the material includes Boron Arsenide.

49. The method of claim 13, wherein the slab crystal includes Titanium doped Sapphire.

50. The method of claim 13, wherein the material includes Boron Arsenide.

* * * * *